United States Patent [19]

Tam et al.

[11] Patent Number: 5,421,943

[45] Date of Patent: Jun. 6, 1995

[54] PULSED CURRENT RESISTIVE HEATING FOR BONDING TEMPERATURE CRITICAL COMPONENTS

[75] Inventors: Andrew C. Tam, Saratoga; Celia E. Yeack-Scranton, San Jose, both of Calif.

[73] Assignee: International Business Machines Corporation, Armonk, N.Y.

[21] Appl. No.: 149,163

[22] Filed: Nov. 8, 1993

Related U.S. Application Data

[63] Continuation of Ser. No. 796,489, Nov. 22, 1991, abandoned.

[51] Int. Cl.⁶ .................................................. B32B 31/00
[52] U.S. Cl. ........................... 156/273.9; 156/274.8; 156/275.7; 156/344; 156/379.6; 156/379.7; 156/295
[58] Field of Search ............... 219/148, 201, 209, 543, 219/544; 156/295, 273.9, 379.6, 379.7, 379.8, 275.5, 275.7, 654, 656; 29/603; 360/103

[56] References Cited

U.S. PATENT DOCUMENTS

| | | | |
|---|---|---|---|
| H629 | 4/1989 | Murdoch | 219/148 |
| 3,790,738 | 2/1974 | Laub | 219/85 |
| 4,298,856 | 11/1981 | Schuchardt | 29/620 X |
| 4,302,737 | 11/1981 | Kausche et al. | 29/620 X |
| 4,374,316 | 2/1983 | Inamori et al. | 219/544 |
| 4,416,713 | 11/1983 | Brooks | 156/64 |
| 4,571,921 | 2/1986 | Wolfson | 53/373 |
| 4,645,146 | 2/1987 | Hall | 156/273.9 X |
| 4,744,850 | 5/1988 | Imano et al. | 156/265 |
| 4,745,263 | 5/1988 | Brooks | 156/273.9 X |
| 4,803,124 | 2/1989 | Kunz | 156/295 |
| 4,859,263 | 8/1989 | Dziurla et al. | 156/233 |
| 4,860,434 | 8/1989 | Louison et al. | 156/275.5 X |
| 4,871,412 | 10/1989 | Felix et al. | 156/273.9 |
| 4,915,519 | 4/1990 | Afzali-Ardakani et al. | 400/120 |
| 4,962,437 | 10/1990 | Wilcox | 360/103 |
| 4,964,941 | 10/1990 | Von Brandt et al. | 156/378 X |
| 5,063,655 | 11/1991 | Lamey et al. | 29/890.1 X |
| 5,064,494 | 11/1991 | Duck et al. | 156/275.5 X |
| 5,079,472 | 1/1992 | Uhl et al. | 310/332 |
| 5,146,303 | 9/1992 | Kornkrumpf et al. | 357/30 |

FOREIGN PATENT DOCUMENTS 2127740A 4/1984 United Kingdom ......... B29C 27/00

*Primary Examiner*—Chester T. Barry
*Attorney, Agent, or Firm*—Joseph C. Redmond, Jr.; Leslie G. Murray

[57] ABSTRACT

Controlled current pulses applied to a shaped resistive heating element formed on the bonding surface of a base or substrate component provide sufficient heat to the bonding interface formed between a chip and the base bonding surface to produce a high bonding temperature at the bonding interface while maintaining an opposite surface of the chip at or below a relatively low temperature critical for components formed or mounted on the chip surface. A layer of a thermally setting thin-film bonding agent is applied over a serpentine-shaped resistive heating element having a relatively narrow linewidth formed on the base component bonding surface. The chip to be bonded is retained in a desired position against the bonding surface over the heating element and bonding agent layer while a current pulse is applied to the heating element via contact pads. The current pulse magnitude and duration are controlled to produce sufficient local heating at the bonding interface to effect the desired bonding without excessive heating of any critical components at some predetermined distance from the bonding site.

32 Claims, 3 Drawing Sheets

PULSED CURRENT RESISTIVE HEATING FOR BONDING TEMPERATURE CRITICAL COMPONENTS

This is a continuation of co-pending application Ser. No. 07/796 489, filed on Nov. 22 1991, abandoned.

BACKGROUND OF THE INVENTION

The present invention relates generally to an apparatus and method for bonding a small, heat sensitive component onto another surface and, more particularly, for bonding heat sensitive chips to a base or substrate utilizing a current-pulsed, shaped resistive heating element to provide localized heating to a thermally setting thin film agent at the bond interface.

In magnetic recording technology, as well as in other technologies generally related to integrated circuit chips and other electronic components, it is often desired to accurately align and bond small components in a controlled and repeatable fashion both in research and manufacturing environments. Often, while one or more critical components may be severely damaged by the high temperature required by most conventional bonding methods, a lower temperature bond may not provide sufficient strength and stability and thus be unacceptable due to creep and delamination generally associated with such low temperature bonds.

It is known in the art to provide localized heating of a heat sensitive bonding agent by direct resistance heating utilizing an interface heater layer or element of a conductive material such as a thin metallic tape or a thick-film conductive paste. For example, published United Kingdom patent application no. 2127740A to Wolfson discloses a method for hermetically sealing a ceramic cover to a ceramic package or housing utilizing a high temperature vitreous sealant without excessively heating the electronic circuits and components therein. A heater layer of electrically conductive material is bonded to the sealing area of the ceramic package, for example. A layer of sealant material is applied over the heater layer and the package cover, for example, is then pressed against the package aligning the sealing area of the cover with the heater and sealant layers while an electric current is applied to the heater layer, causing the sealant material to bond to the heater layer thus bonding the cover to the package. To concentrate the thermal energy at the bonding area and minimize heating of components mounted within the package, portions of the package are comprised of ceramic material having a relatively low degree of thermal conductivity. Since it is also a necessary function of the package to conduct heat away from the electronic components therein, other portions of the package are necessarily comprised of a ceramic material having a high degree of thermal conductivity. While Wolfson effectively minimizes adverse heating of components mounted therein, at least two different ceramic materials having differing degrees of thermal conductivity are required for the package, thus increasing the complexity and expense of the package fabrication. Additionally, while most components within the package of Wolfson are mounted relatively large distances from the package sealing areas, critical components mounted at or in close proximity to the bonding site will not be thermally protected.

SUMMARY OF THE INVENTION

In accordance with the principles of the present invention, a method of bonding small, temperature critical components to one another or to larger base components comprises forming a shaped heating element on a surface of a first component or substrate, coating said shaped heating element with a layer of a heat sensitive, thermally setting bonding agent, placing a bonding surface of a second component over said bonding agent layer and shaped heating element and in contact with the surface of said first component, and applying an electric current pulse to said shaped heating element for heating and thermally actuating said bonding agent thus bonding the two components together or bonding the second component to said substrate.

Additionally, the present invention provides shaped heating element means to effect localized heating at a bonding interface for use in a manufacturing environment.

In accordance with the present invention, a resistive heating element having contact pins or pads at each end is formed or patterned, such as by a well-known screen printing process, on a bonding surface of a base or substrate component. The bonding surface and the heating element are coated with a layer of a suitable thermally setting thin film bonding agent. The bonding surface may be made non-wetting such that only the heating element is coated with the bonding agent. The component to be bonded is retained in a desired position against the bonding surface over the heating element and bonding agent while one or more current pulses are passed through the heating element via the contact pads. The pulse magnitude and duration are controlled to provide sufficient heat and temperature at the bonding interface to affect the desired bonding without excessive heating of any critical components. Proper tailoring of the current pulse and shaping of the heating element can provide temperatures in the range of between 400° C. to 600° C. at the bond interface while maintaining a temperature less than 200° C. at a critical component as close as 250–500 micrometers (um) from the bond interface. Tailoring the pulse shape also provides an optimum heating and cooling profile to minimize the thermal shock to the bond, thus minimizing delamination and cracking of the bond.

The shape of the resistive heating element is designed to provide even heating over the area of the bonding interface between the bonding components. The shaped heating element provides a similarly shaped bond line having a width of much smaller dimension than the bonding interface to greatly reduce shear stress in the bond. Additionally, the shape of the heating element greatly reduces bond creep and the probability of bond delamination.

DETAILED DESCRIPTION OF THE PREFERRED EMBODIMENT

Figure 1:
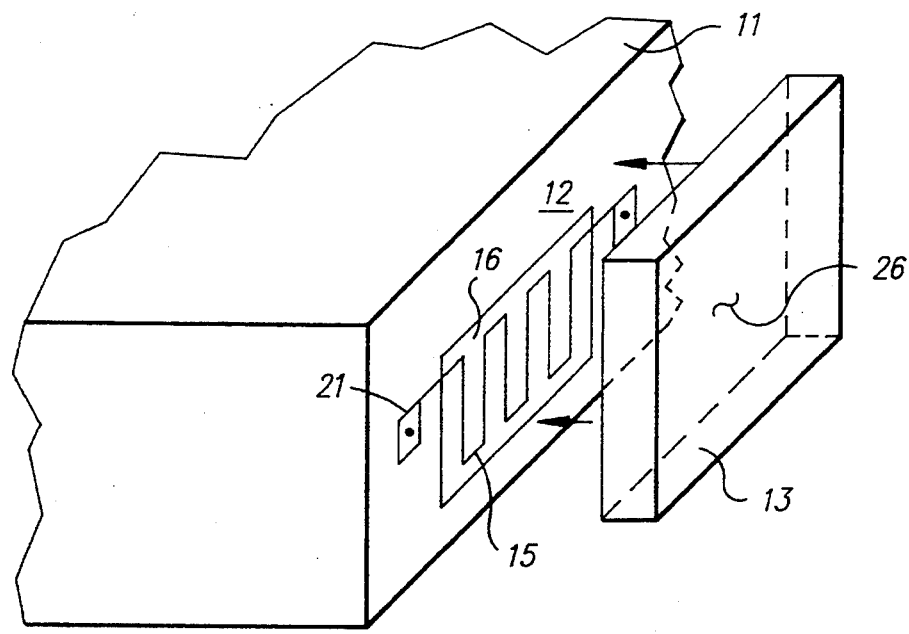
FIG. 1 is a perspective view of a component having a heater element formed on a bonding surface thereof in accordance with the principles of the present invention.

Referring now to FIG. 1, a base or substrate 11 having a shaped heating element 15 formed on a bonding surface 12 is shown. The heating element 15 and surrounding portions of the surface 12 are coated with a layer 16 of a suitable thermally setting thin film bonding agent. One or more desired components 13 are then positioned on the surface 12 over the heating element 15 for bonding thereto. The heating element 15 is provided with plural contacts or connection pads 21 to allow the heating element to be pulsed electrically to achieve controlled local heating.

Figure 2:
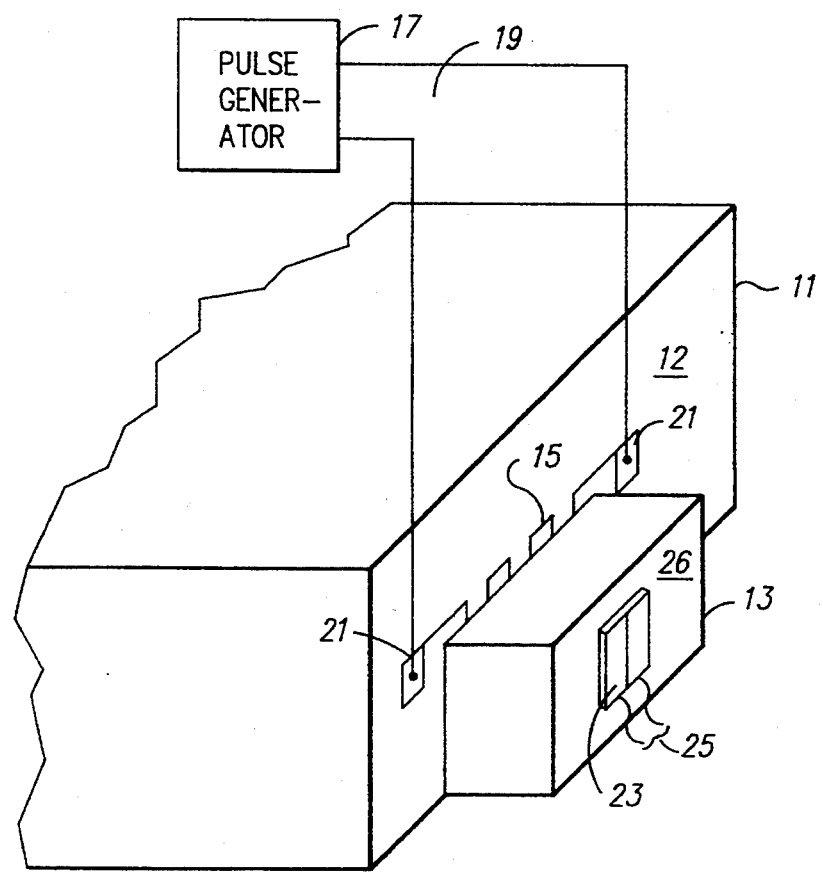
FIG. 2 is a perspective view of a component bonded to a substrate illustrating the method of the present invention.

Referring now also to FIG. 2, an electric pulse generator 17 is temporarily connected to the heating element via contact pads 21 during an assembly process to provide controlled heating at the bonding interface between electronic component 13 and bonding surface 12. The output of the pulse generator 17 comprises a series of current pulses in which the pulse magnitude, both current and voltage, the pulse width and the pulse repetition rate are controlled to provide a predetermined amount of power having a desired time distribution to the bonding interface.

Figure 5:
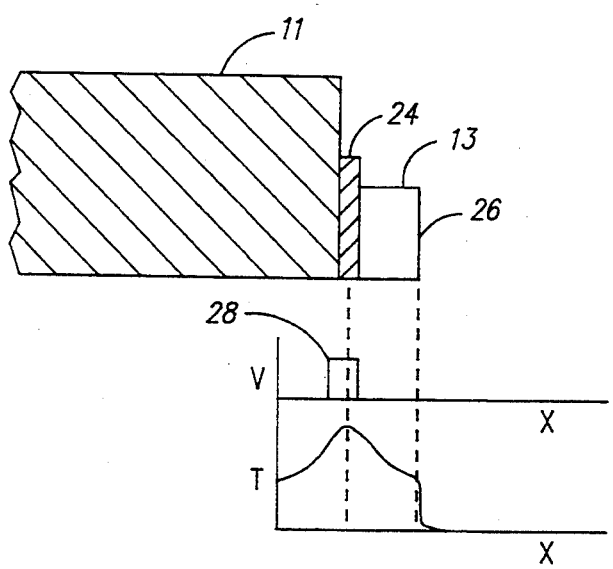
FIG. 5 is a diagram illustrating the time and spatial temperature profile for two components being bonded together at a bonding interface in accordance with the principles of the present invention.

In one preferred embodiment wherein a ceramic or silicon chip 13 having a thin film magnetic recording head or read/write transducer formed on an outwardly facing surface 26 thereof is bonded to a larger magnetic recording slider 11, for example, the bond interface is spaced approximately 250-500 um from the magnetic recording head element formed on surface 26 parallel to the bond interface. In this example, utilizing pulses of less than one millisecond at an appropriate current and voltage, the bond interface is heated to approximately 400°-600° C. peak temperature while maintaining the magnetic recording head element on surface 26 at a peak temperature of less than 200° C. (as shown in FIG. 5). In another preferred embodiment, a magnetic read/write transducer fabricated on a ceramic or silicon chip forming an integral transducer/slider component is bonded to a suspension arm for use in magnetic disk storage device, for example.

An alignment device 23 is temporarily attached to the component surface 26 to adjust angle and displacement and thus provide accurate positioning of component 13 during the bonding process. Appropriate control signals are coupled to alignment device 23 via leads 25 to facilitate desired alignment of the component on the surface 12 during the bonding process. Additionally, a separate bender device (not shown) may be utilized to apply a force normal to the bonding interface thus pressing component 13 against the bonding surface 12 during the bonding process. Alignment and bender devices will be discussed in greater detail herein below with reference to FIG. 6.

Figure 3D:
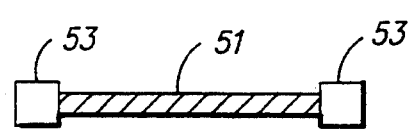
FIGS. 3a–3d are plan views of different embodiments of the shaped heating element shown in FIGS. 1 and 2.
Figure 3A:
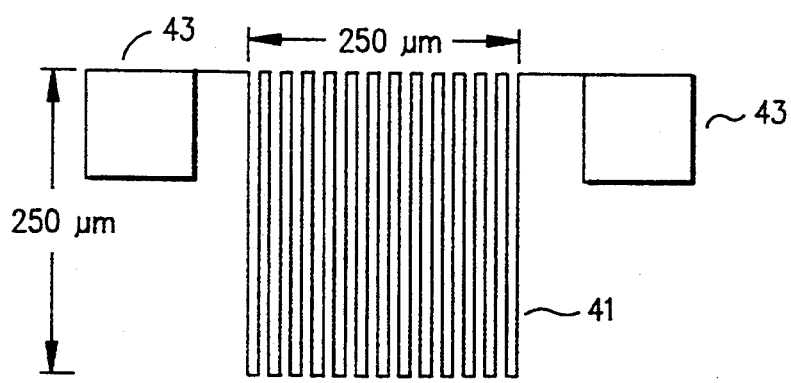
Figure 3B:
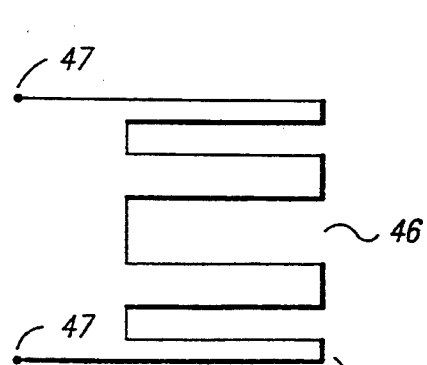
Figure 3C:
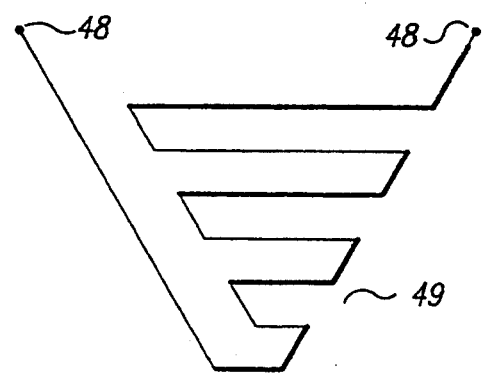

Referring now to FIGS. 3a-3d, the shape and dimensions of the heating element 15 are important not only to achieve an even heating pattern and desired temperature profiles, but also to minimize thermally induced stress in the components being bonded. A serpentine-shaped resistor 41 or a uniform flat spiral-shaped resistor (not shown) provides a generally even heat pattern at a bond interface satisfactory for most applications. However, a uniform serpentine-shaped resistor 41 (as shown in FIG. 3a) tends to generate higher temperatures towards the center and lower temperatures towards the edges of the heat pattern. A non-uniform serpentine-shaped resistor 45 having widely spaced legs at the center portion 46 and less widely separated legs at the periphery of the serpentine-shaped resistor 45 minimizes hot spots in the heat pattern and provides a flatter temperature distribution at the bond interface. Applications requiring non-uniform heat patterns and temperature distributions at the bond interface may be achieved utilizing different shaped heating elements such as the triangular-shaped serpentine resistor 49 shown in FIG. 3c. In certain applications, an application wherein a possible central hot spot would not be a potential problem, for example, a straight line-shaped resistor 51 having contact pads 53 as shown in FIG. 3d is preferred.

The heating element resistor is fabricated from any suitable electrical conductive material. In a preferred embodiment the serpentine resistor 41 is fabricated of hafnium diboride. Such shaped resistors having line widths of less than 5 um and contact pins or pads 43 are easily achieved utilizing well-known photolithography or screen printing or other suitable deposition techniques. Similarly, sheet resistors may be formed on a bonding surface utilizing well-known deposition techniques.

Figure 4:
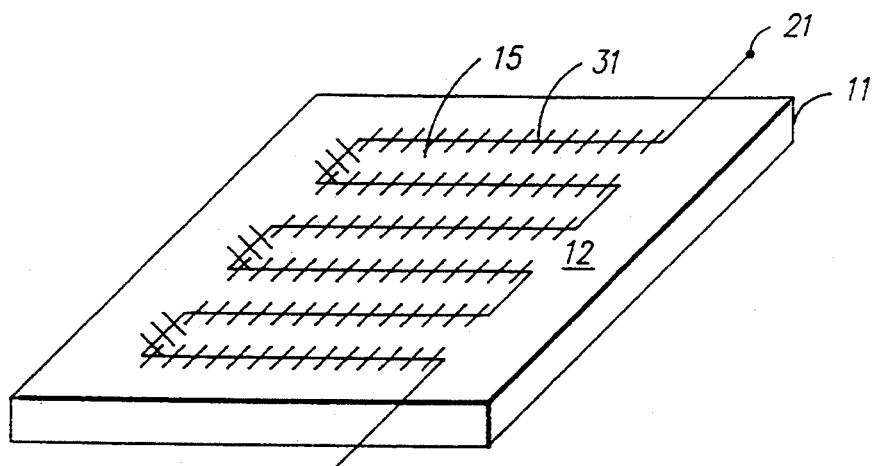
FIG. 4 is a perspective view of a substrate illustrating a coated heating element formed thereon in accordance with the principles of the present invention.

Referring now also to FIG. 4, the shape and dimensions of the bonding material trace or layer is a critical factor for achieving a bond of sufficient strength and having minimum stress induced bond creep and probability of bond delamination. Since a low bond aspect ratio, that is the ratio of the bond width to the bond thickness, greatly improves the bond quality (considering bond creep and stress, for example), line or trace patterns or dot matrix patterns of bonding material are utilized rather than continuous layers of bonding material. For example, spaced droplets of bonding material are applied along the length of the line resistor 51 to reduce bond stress and provide resilience minimizing the potential of bond delamination. The bonding agent can be a metal, that of the resistor or a thin film layer deposited over the resistor, glass, spun on epoxy, or any suitable thermally setting thin film bonding agent. In a preferred embodiment, the substrate or component material 11 is selected such that the material forming the bonding surface 12 is non-wetting for the selected bonding material, thus only the serpentine resistor film 15 is coated. A layer of bonding material 31 is applied to the bonding surface 12 over the heating element 15, providing a bonding line having the same dimensions as the heating resistor lines. Because the width of the bond line is reduced to essentially the width of the resistor line, the bond aspect ratio is low and the residual shear stress in such a bond is greatly reduced.

Referring now to FIG. 5, a diagram illustrating the time and spatial relationship between a current pulse applied to the heating element at the bond interface 24 between two components 11,13 being bonded together and the temperature profile at the interface 24 and the outwardly facing surface 26 for the chip component 13 is shown. Sufficient energy must be provided to the heating element at interface 24 to heat the bonding agent to relatively high temperatures for a sufficient period of time to effect the desired bond without heating components mounted on surface 26, a thin film magnetic read/write transducer, for example, beyond a critical temperature. The current pulse 28 is tailored to have step increase or relatively steep ramp increase with a quick drop, such as a square pulse or sawtooth pulse, having the appropriate magnitude and duration to minimize excessive energy provided to the interface 24. If multiple current pulses are required, the pulse repetition rate is chosen to allow sufficient spatial dissipation of heat from the surface 26 to maintain the temperature at surface 26 below the critical value. For some applications, the base or substrate 11 may be comprised of a material having a relatively high degree of heat conductivity to serve as a heat sink for the bond interface 24.

Figure 6:
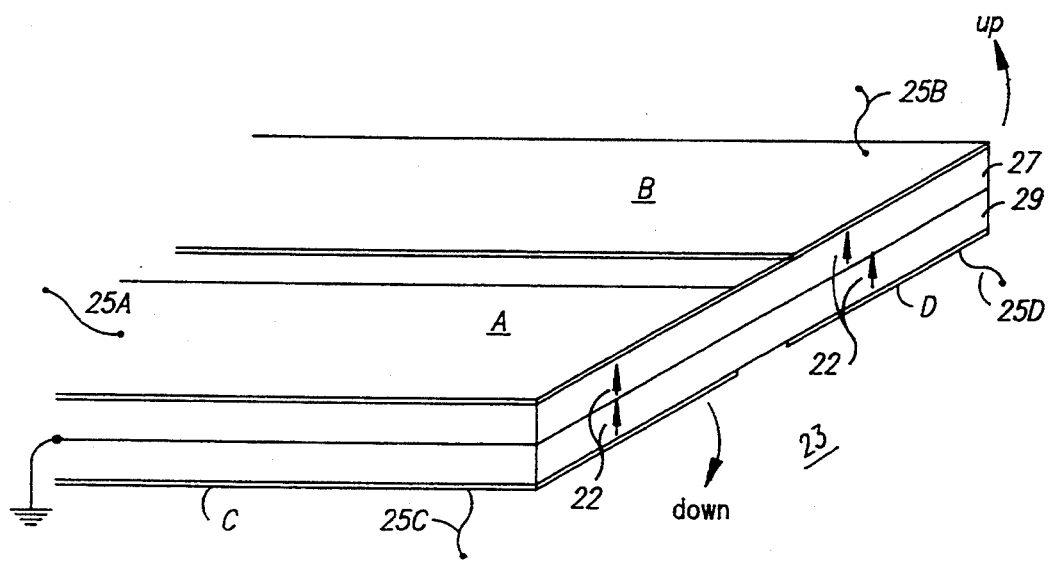
FIG. 6 is a perspective view illustrating a piezoelectric alignment device for use as shown in FIG. 2.

Referring now to FIG. 6, a three-degree of freedom piezoelectric bender device is shown. Essentially, such a piezoelectric bender device comprises a pair of elongated rectangular flat substrates 27,29 bonded together at a grounded interface, each substrate having a layer of piezoelectric material deposited in parallel, lengthwise strips on the substrate surface opposite the grounded interface. Each of the piezoelectric strips A,B,C and D, has a width slightly less than half the width of the substrate and is connected to a power source via leads 25a,25b,25c and 25d, respectively. When the appropriate voltages and polarities are applied to the respective piezoelectric strips, a free end of the bender device 23 will rotate up or down about a transverse axis in the plane of the bender device or twist about a longitudinal axis in the plane of the bender device. Alternatively, the bender device 23 can be comprised of two flat sheets of piezoelectric material bonded together at a grounded interface having electrode subsections A,B,C and D formed with arrows 22 indicating the pole direction of each electrode subsection A,B,C and D, respectively.

Utilizing one or more such bender devices 23 (as shown in FIG. 2) the position and orientation of a component 13 on the surface 12 may be adjusted as required. Additionally, pressure may be applied normal to the bonding interface to provide heat sinking at the component outer surface 26 and to ensure a thin bonding interface and total contact of the bonding material with the bonding surfaces of both components 11,13. A suitable ultrasonic signal may be applied to one or more piezoelectric bender devices to ultrasonically excite the bonding interface during the bonding process. Such ultrasonic excitation during the bonding process can provide pressure, localized heating and sheer action, thus enhancing the strength and stability of the resulting bond.

While the present invention has been particularly shown and described with reference to a preferred embodiment thereof, it will be understood by those skilled in the art that various changes in the form and details may be made therein without departing from the spirit and scope of the appended claims.

We claim:

1. A method of bonding heat sensitive components to one another or to a substrate comprising the following steps:

forming a specially shaped heating element on a surface of a first component to achieve a flat temperature distribution across the first component without hot spots;

coating said shaped heating element with a layer of a thermally setting bonding agent to have a low bond aspect ratio where the bond aspect ratio is the ratio of the bond width to bond thickness, and the bond thickness is greater than the bond width;

contacting said surface of said first component with a surface of a second component, said shaped heating element, said bonding surface and said bonding agent layer disposed there among forming a bonding interface; and applying an electrical current pulse to said shaped heating element, said current pulse having a predetermined pulse profile, for heating and thermally actuating said bonding agent to effect a bond between said first and second components, said pulse raising the temperature in the bonding interface to a range of 400–600 degrees centigrade while maintaining a temperature in the second component to less than 200 degrees Centigrade at a distance, in the range of 250–500 micrometers, from the bonding interface.

2. A method as in claim 1 wherein said shaped heating element comprises a shaped thin-film resistor having a predetermined resistivity.

3. A method as in claim 2 wherein said thin-film resistor has a triangular shape.

4. A method as in claim 2 wherein said thin-film resistor has a non-uniform serpentine shape.

5. A method as in claim 2 wherein said thin-film resistor has widely spaced legs at a center portion and less widely-spaced legs at the periphery of the resistor.

6. A method as in claim 2 wherein said thin-film resistor comprises hafnium diboride.

7. A method as in claim 1 wherein said step of forming said shaped heating element comprises deposition of electrical conductive material utilizing photolithographic processes for forming said shaped heating element.

8. A method as in claim 1 wherein said current pulse delivers a predetermined amount of power to said shaped heating element.

9. A method as in claim 8 wherein said current pulse has a predetermined pulse length.

10. A method as in claim 9 wherein said current pulse has a pulse length substantially equal to one millisecond.

11. A method as in claim 9 wherein said current pulse has a pulse length of less than one millisecond.

12. A method as in claim 1 wherein said step of applying an electric current pulse to said shaped heating element includes the step of temporarily connecting signal generator means to said shaped resistor, said signal generator means generating an electric current pulse having a selectable pulse profile.

13. A method as in claim 1 wherein said first component surface adjacent said shaped heating element comprises a material which is non-wettable by said bonding agent.

14. A method as in claim 1 wherein said bonding agent has a width substantially equal to the width of said shaped heating element.

15. A method of bonding a chip having a magnetic transducer formed on a first surface thereof to a support element, said method comprising the following steps:

forming a non-uniform serpentine shaped heating element on a bonding surface of said support element;

coating said shaped heating element with a layer of a thermally setting bonding agent, said layer of bonding agent having a width substantially equal to the width of the shaped heating element and a thickness greater than the width to achieve a low aspect ratio;

contacting said bonding surface of said support element with a bonding surface of said chip, said shaped heating element and said bonding agent layer disposed therebetween;

determining an electric pulse profile wherein an electric pulse applied to said shaped heating element provides sufficient heat at said interface to activate said thermally setting bonding agent while maintaining said heat sensitive magnetic transducer at a non-damaging temperature in the range of 200 degrees centigrade; and applying an electric pulse having said determined pulse profile to said shaped heating element, for heating and thermally actuating said bonding agent to effect a bond between said support element and said chip, the non-uniform serpentine shaped heating element providing a flat temperature distribution at the bond without hot spots.

16. A method as in claim 15 wherein said magnetic transducer comprises a thin-film magnetic read/write transducer.

17. A method as in claim 16 wherein said support element comprises a slider.

18. A method as in claim 15 wherein said magnetic transducer comprises an integral thin-film magnetic transducer formed on a surface of a slider.

19. A method as in claim 18 wherein said support element comprises a magnetic head suspension arm.

20. Apparatus for effecting a bond between a chip having heat sensitive components mounted on a surface thereof and a support element, said apparatus comprising:

a non-uniform shaped serpentine heating element formed on a bonding surface of said support element;

a layer of a thermally setting bonding agent deposited on said bonding surface of said support element, the bonding agent having a width and a thickness greater than the width to achieve a low aspect ratio, said bonding agent layer disposed on the heating element in spaced droplets between said bonding surface of said support element and a bonding surface of said chip when said chip is positioned adjacent to and in contact with said support element, said shaped heating element responsive to an electric pulse applied thereto for heating and thermally actuating said bonding agent to a range of 400-600 degrees Centigrade to effect a bond between said support element and said chip said electric pulse having a predetermined electric pulse profile to control heat in the bonding layer wherein an electric pulse applied to said shaped heating element provides sufficient heat at said interface to activate said layer of thermally setting bonding agent while maintaining said heat sensitive components at a non-damaging temperature less than 200 degrees Centigrade.

21. Apparatus as in claim 20 further comprising pulse generating means coupled to said shaped heating element for generating said electric pulse, said electric pulse having a selectable pulse profile.

22. Apparatus as in claim 20 wherein said shaped heating element comprises a shaped thin-film resistor having a predetermined resistivity.

23. Apparatus as in claim 22 wherein said chip comprises a substrate having a magnetic transducer fabricated on said first surface thereof.

24. Apparatus as in claim 23 wherein said support element comprises a slider.

25. Apparatus as in claim 20 wherein said chip comprises an integral thin-film magnetic transducer formed on a surface of a slider, said slider being bonded to said support element at said bonding surface.

26. Apparatus as in claim 25 wherein said support element comprises a magnetic storage device suspension arm.

27. Apparatus as in claim 20 wherein said bonding surface of said support element comprises a selected material which is non-wettable by said bonding agent, said layer of bonding agent coating said shaped heating element only.

28. Apparatus as in claim 27 wherein said layer of bonding agent comprises a pattern of droplets for forming a matrix of said bonding agent coating said shaped heating element.

29. Apparatus as in claim 27 wherein said shaped heating element comprises a thin-film resistor having a triangular shape.

30. Apparatus as in claim 27 wherein said shaped heating element comprises a thin-film resistor having widely spaced legs at a center portion and less widely shaped legs at the periphery of the resistor.

31. Apparatus as in claim 20 wherein said bonding agent layer has a width substantially equal to the width of said shaped heating element.

32. A method comprising:

providing a ceramic or silicon chip having a thin film magnetic recording head or read/write transducer;

forming a non-uniform serpentine-shaped hafnium diboride resistive heating element having a line width of less than 5 um and widely spaced legs at the center portion and less widely separated legs at the periphery having contact pins or pads at each end on a bonding surface of a base or the chip;

rendering the bonding surface non-wetting;

applying a line or trace coating of thermally setting thin film bonding material to the heating element to achieve a low aspect ratio where the bond aspect ratio is the ratio of the bond width to bond thickness, such that the width of the bonding material line is essentially the width of the resistor line and less than the thickness of the bonding material line;

retaining the chip against the bonding surface over the heating element; and passing one or more current pulses having a tailored shape through the heating element via the contact pads to provide temperatures in the range of 400-600 degrees Centigrade at the bond interface while maintaining the head or transducer spaced 250-500 um from the bond interface at a temperature less than 200 degrees Centigrade, thereby thermally setting the thin film bonding agent and bonding the head or transducer to the bonding surface.

* * * * *